(12) United States Patent
Klostermann

(10) Patent No.: US 7,697,313 B2
(45) Date of Patent: Apr. 13, 2010

(54) INTEGRATED CIRCUIT, MEMORY CELL, MEMORY MODULE, METHOD OF OPERATING AN INTEGRATED CIRCUIT, AND METHOD OF MANUFACTURING A MEMORY CELL

(75) Inventor: Ulrich Klostermann, Munich (DE)

(73) Assignees: Qimonda AG, Munich (DE); ALTIS Semiconductor, SNC, Corbeil Essonnes Cedex (FR)

( * ) Notice: Subject to any disclaimer, the term of this patent is extended or adjusted under 35 U.S.C. 154(b) by 231 days.

(21) Appl. No.: 11/873,289

(22) Filed: Oct. 16, 2007

(65) Prior Publication Data

US 2009/0097298 A1    Apr. 16, 2009

(51) Int. Cl.
*G11C 5/06* (2006.01)

(52) U.S. Cl. .................. 365/63; 365/158; 365/171; 365/173

(58) Field of Classification Search .................. 365/158, 365/63, 171, 173
See application file for complete search history.

(56) References Cited

U.S. PATENT DOCUMENTS

| 6,873,542 B2 * | 3/2005 | Gider et al. .................. 365/158 |
| 7,120,048 B2 * | 10/2006 | Sundstrom .................. 365/158 |
| 7,457,149 B2 * | 11/2008 | Ho et al. ..................... 365/158 |
| 2006/0227466 A1 * | 10/2006 | Yagami .................. 360/324.2 |

* cited by examiner

*Primary Examiner*—Pho M Luu
*Assistant Examiner*—Tha-O Bui
(74) *Attorney, Agent, or Firm*—Slater & Matsil, L.L.P.

(57) ABSTRACT

According to one embodiment, an integrated circuit includes an arrangement of memory cells. Each memory cell is connected to a programming current path used for programming the memory cell, and a sensing current path used for sensing the memory state of the memory cell. The programming current path and the sensing current path are at least partly separated from each other.

19 Claims, 9 Drawing Sheets

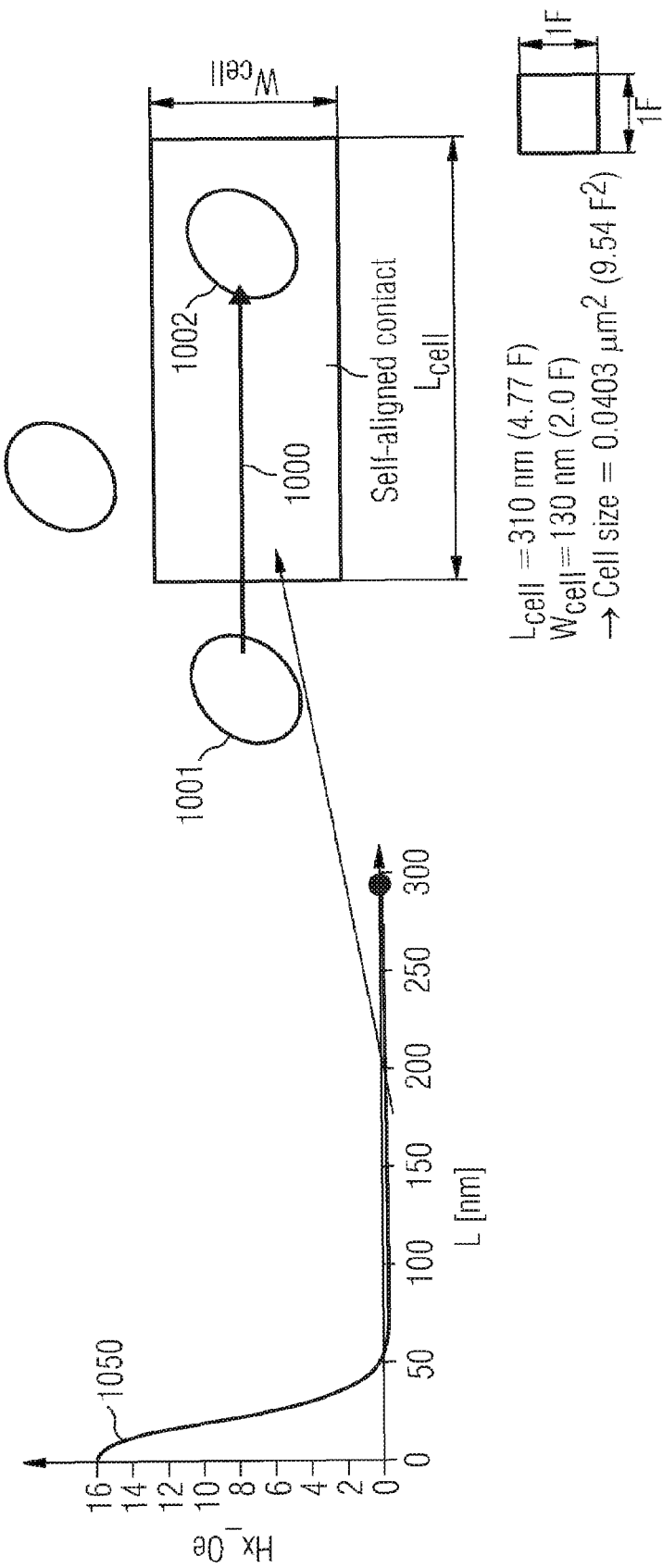

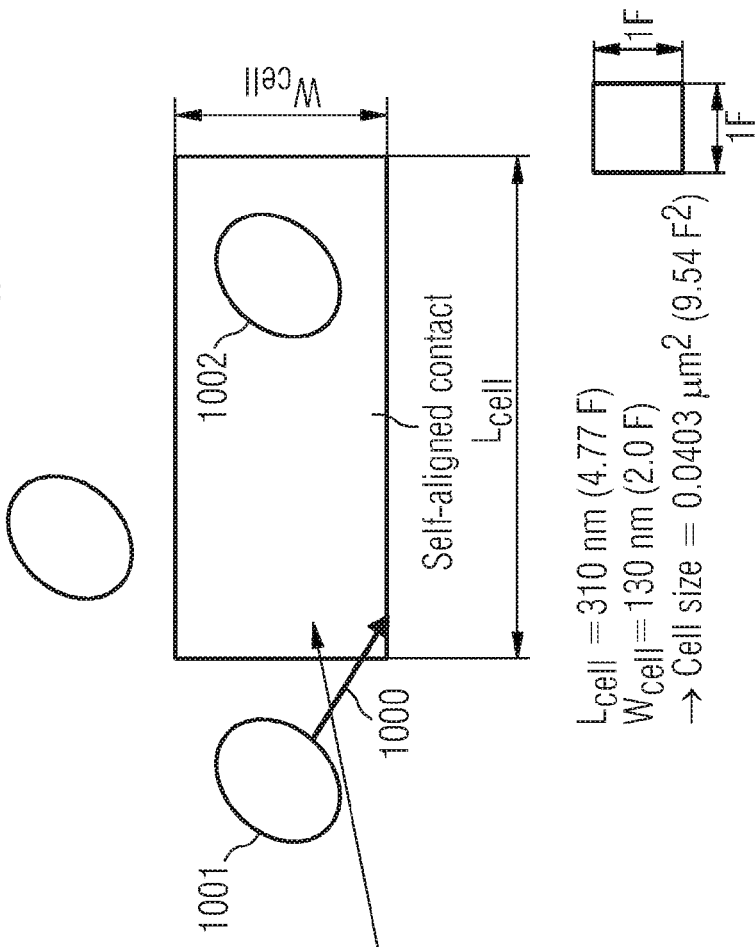
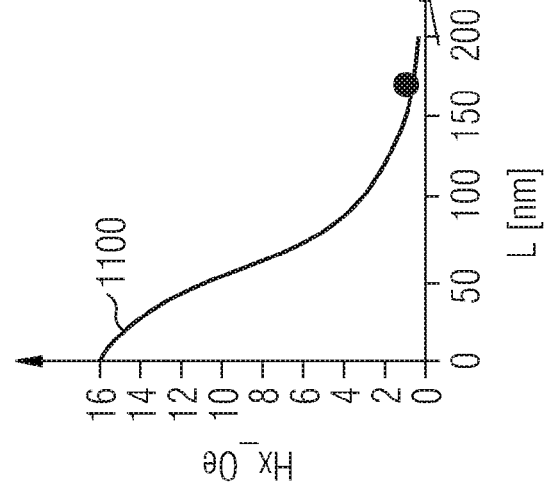

FIG 12

What is the estimated current in thin BL

| Current Density [mA/μm²] | BL width [nm] | BL height [nm] | Maximum Allowed Current [mA] | Maximum Allowed Current [μA] | Desired Heating Power [μWatt] | Choose Drive Current [μA] | Needed Voltage [V] | Required Heat Resistor [Ohm] |
|---|---|---|---|---|---|---|---|---|
| 85 | 65 | 10 | 0.05525 | 55 | 50 | 27.63 | 1.81 | 65 519 |
| 85 | 65 | 20 | 0.1105 | 111 | 50 | 55.25 | 0.90 | 16 380 |
| 85 | 65 | 30 | 0.16575 | 166 | 50 | 82.88 | 0.60 | 7 280 |
| 85 | 65 | 40 | 0.221 | 221 | 50 | 110.50 | 0.45 | 4 095 |
| 85 | 65 | 50 | 0.27625 | 276 | 50 | 138.13 | 0.36 | 2 621 |
| 85 | 65 | 60 | 0.3315 | 332 | 50 | 165.75 | 0.30 | 1 820 |
| 85 | 65 | 70 | 0.38675 | 387 | 50 | 193.38 | 0.26 | 1 337 |
| 85 | 65 | 80 | 0.442 | 442 | 50 | 221.00 | 0.23 | 1 024 |

Check for different current thresholds:

| | | | | | | | | |
|---|---|---|---|---|---|---|---|---|
| 85 | 65 | 20 | 0.1105 | 111 | 50 | 110.50 | 0.45 | 4 095 |
| 85 | 65 | 20 | 0.1105 | 111 | 50 | 55.25 | 0.90 | 16 380 |
| 85 | 65 | 20 | 0.1105 | 111 | 50 | 36.83 | 1.36 | 36 854 |
| 85 | 65 | 20 | 0.1105 | 111 | 50 | 27.63 | 1.81 | 65 519 |
| 85 | 65 | 20 | 0.1105 | 111 | 50 | 13.81 | 3.62 | 262 075 |

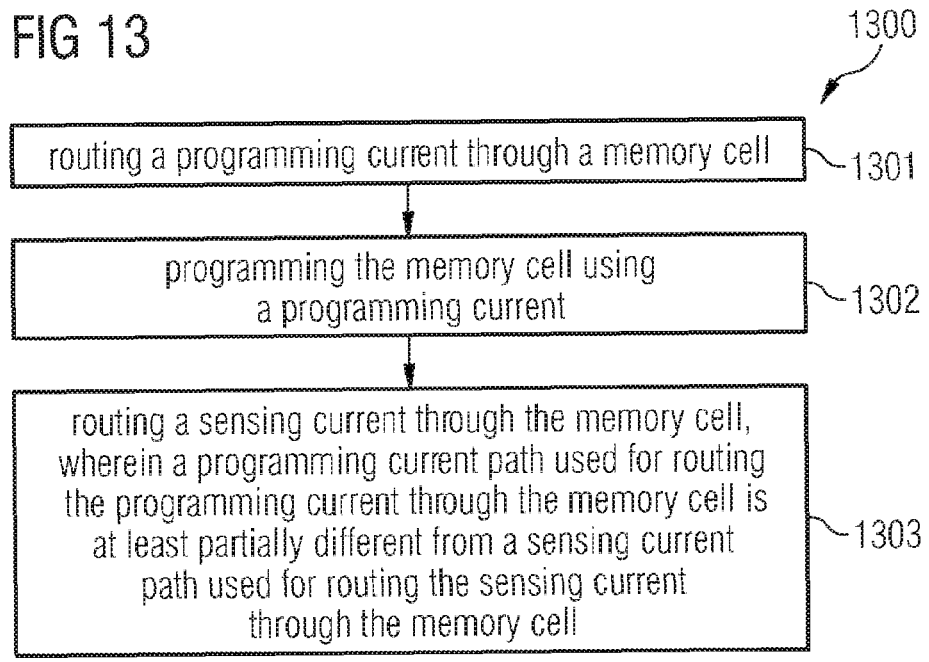
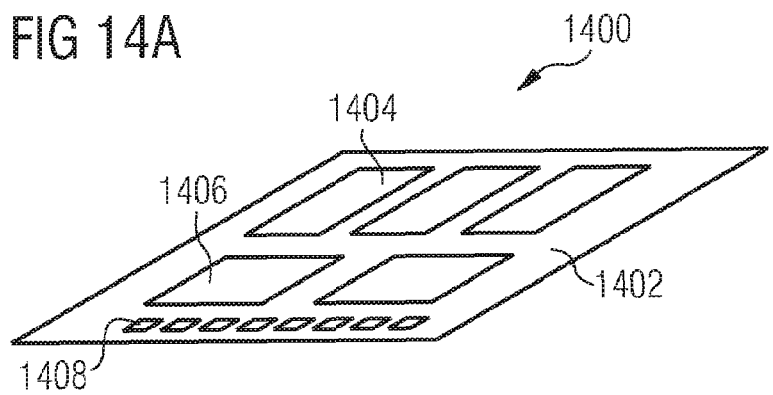
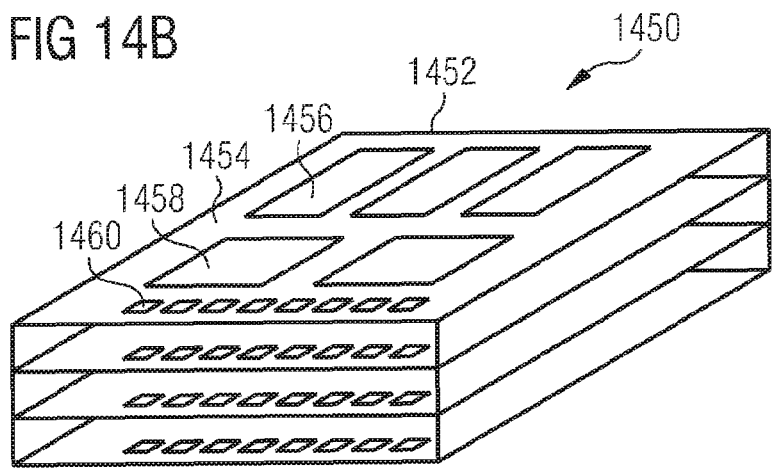

INTEGRATED CIRCUIT, MEMORY CELL, MEMORY MODULE, METHOD OF OPERATING AN INTEGRATED CIRCUIT, AND METHOD OF MANUFACTURING A MEMORY CELL

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 10A shows the strength of a magnetic stray field caused by a memory cell along a first direction;

FIG. 10B shows the direction along which the strength of a stray field is shown in FIG. 11A;

FIG. 11A shows the strength of a stray field caused by a memory cell along a second direction;

FIG. 11B shows the direction along which the strength of the stray field is shown in FIG. 11A;

FIG. 12 shows sets of cell parameters of integrated circuits according to embodiments of the present invention;

FIG. 13 shows a flow chart of a method of operating an integrated circuit according to one embodiment of the present invention;

FIG. 14A shows a schematic drawing of a memory module according to one embodiment of the present invention; and FIG. 14B shows a schematic drawing of a memory module according to one embodiment of the present invention.

DETAILED DESCRIPTION OF ILLUSTRATIVE EMBODIMENTS

Figure 1:
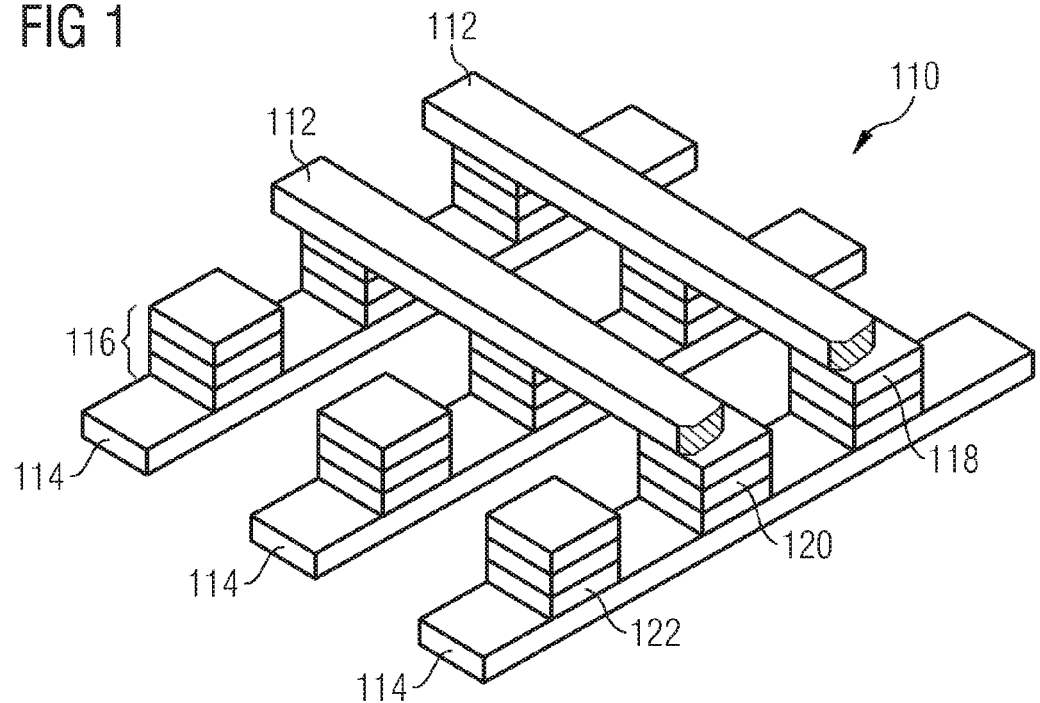
FIG. 1 shows a perspective view of a magneto-resistive memory device.

According to one embodiment of the present invention, an integrated circuit is provided comprising an arrangement of memory cells, wherein each memory cell is connected to a programming current path used for programming the memory cell, and a sensing current path used for sensing the memory state of the memory cell, and wherein the programming current path and the sensing current path are at least partially separated from each other.

According to one embodiment of the present invention, the memory cells are thermal selectable magneto-resistive memory cells, or wherein the memory cells are spin injection current switching selectable memory cells.

According to one embodiment of the present invention, each memory cell comprises a storage memory element and a sensing memory element being spatially separated from the storage memory element.

According to one embodiment of the present invention, the programming current path runs through the storage memory element, and wherein the sensing current path runs through the sensing memory element.

According to one embodiment of the present invention, the distance between a sensing memory element and a storage memory element belonging to the same memory cell is chosen such that a stray field caused by the magnetization of the storage memory element causes the sensing memory element to adapt the same magnetization as that of the storage memory element.

According to one embodiment of the present invention, the lateral distance between neighboring sensing memory elements and neighboring storage memory elements is chosen such that a stray field caused by the magnetization of a storage memory element does not change the magnetization of the neighboring sensing memory elements and the magnetization of the neighboring storage memory elements.

According to one embodiment of the present invention, between a storage memory element and a sensing memory element belonging to the same memory cell a first conductive line is arranged which is both part of the programming current path and the sensing current path of the memory cell.

According to one embodiment of the present invention, the thickness of the first conductive line falls in a range extending from about 7 nm to about 50 nm.

According to one embodiment of the present invention, between a storage memory element and a sensing memory element belonging to the same memory cell a conductive plate is arranged which is both part of the programming current path and the sensing current path.

According to one embodiment of the present invention, the conductive plate is a continuous plate which is shared between a plurality of memory cells.

According to one embodiment of the present invention, the thickness of the conductive plate falls in a range extending from about 5 nm to about 50 nm.

According to one embodiment of the present invention, the integrated circuit further includes a second conductive line disposed above a first conductive line or disposed above a conductive plate, wherein one of the sensing memory element and the storage memory element is electrically connected between the first conductive line and the second conductive line, or is electrically connected between the conductive plate and the second conductive line, and wherein the other one of the sensing memory element and the storage memory element is disposed below the first conductive line or the conductive plate, and is electrically connected to the first conductive line or the conductive plate.

According to one embodiment of the present invention, the other one of the sensing memory element and the storage memory element is electrically connectable to a conductive element set to a fixed potential.

According to one embodiment of the present invention, the conductive element set to a fixed potential is connectable to the other one of the sensing memory element and the storage memory element by applying a voltage to a third conductive line.

According to one embodiment of the present invention, the first conductive line or the conductive plate is a read/write bit line, the second conductive line is a read word line, and the third conductive line is a write word line.

According to one embodiment of the present invention, the integrated circuit further includes a heating barrier which is heated by the heating current and which is connected between the storage memory element and one of the first conductive line, the second conductive line, and the conductive plate, or comprising a spin torque barrier which is connected between the storage memory element and one of the first conductive line, the second conductive line, and the conductive plate.

According to one embodiment of the present invention, a sensing barrier is connected between the sensing memory element and one of the first conductive line, the second conductive line, and the conductive plate.

According to one embodiment of the present invention, the sensing barrier is optimized for a memory state sensing process, and the heating barrier is optimized for a memory cell heating process, and the spin torque barrier is optimized for a memory cell writing process.

According to one embodiment of the present invention, the distance between a sensing memory element and a storage memory element belonging to the same memory cell is about 10 nm to about 100 nm.

According to one embodiment of the present invention, the pitch between the neighboring memory cells is larger than the distance between a storage memory element and a sensing memory element belonging to the same memory cell.

According to one embodiment of the present invention, the distance between the storage memory element and the sensing memory element of one memory cell is smaller than or equal to the lateral extent of the storage memory element.

According to one embodiment of the present invention, a memory cell is provided, wherein the memory cell is connectable to a programming current path used for heating the memory cell, and a sensing current path used for sensing the memory state of the memory cell, and wherein the programming current path and the sensing current path are at least partially separated from each other.

According to one embodiment of the present invention, a memory module comprising at least one integrated circuit comprising an arrangement of memory cells is provided, wherein each memory cell is connected to a programming current path used for heating the memory cell, and a sensing current path used for sensing the memory state of the memory cell, and wherein the programming current path and the sensing current path are at least partially separated from each other.

According to one embodiment of the present invention, the memory module is stackable.

According to one embodiment of the present invention, a method of operating an integrated circuit comprising an arrangement of thermal selectable magneto-resistive memory cells is provided, the method comprising: routing a programming current through a memory cell; programming the memory cell using a programming current; routing a sensing current through the memory cell; wherein a programming current path used routing the heating current through the memory cell is at least partially different from a sensing current path used for routing the sensing current through the memory cell.

According to one embodiment of the present invention, the method includes: providing a storage memory element; providing a conductive line or conductive plate above the storage memory element; and providing a sensing memory element above the conductive line or conductive plate, wherein the storage memory element, the conductive line or conductive plate, and the sensing memory element are provided such that the storage memory element is electrically connected to the sensing memory element via the conductive line or conductive plate.

Since the embodiments of the present invention can be applied to magneto-resistive memory devices which include resistivity changing memory cells (magneto-resistive memory cells), a brief discussion of magneto-resistive memory devices will be given. Magneto-resistive memory cells involve spin electronics, which combines semiconductor technology and magnetics. The spin of an electron, rather than the charge, is used to indicate the presence of a "1" or "0". One such spin electronic device is a magnetic random-access memory (MRAM), which includes conductive lines positioned perpendicular to one another in different metal layers, the conductive lines sandwiching a magnetic stack. The place where the conductive lines intersect is called a cross-point. A current flowing through one of the conductive lines generates a magnetic field around the conductive line and orients the magnetic polarity into a certain direction along the wire or conductive line. A current flowing through the other conductive line induces the magnetic field and can also partially turn the magnetic polarity. Digital information, represented as a "0" or "1" is stored in the alignment of magnetic moments. The resistance of the magnetic component depends on the moment's alignment. The stored state is read from the element by detecting the component's resistive state. A memory cell may be constructed by placing the conductive lines and cross-points in a matrix structure or array having rows and columns.

FIG. 1 illustrates a perspective view of a MRAM device 110 having bit lines 112 located orthogonal to word lines 114 in adjacent metallization layers. Magnetic stacks 116 are positioned between the bit lines 112 and word lines 114 adjacent and electrically coupled to bit lines 112 and word lines 114. Magnetic stacks 116 preferably include multiple layers, including a free layer 118, a tunnel layer 120, and a hard layer 122, for example. Free layer 118 and hard layer 122 preferably include a plurality of magnetic metal layers, for example, eight to twelve layers of materials such as PtMn, CoFe, Ru, and NiFe, as examples. A logic state is storable in the free layer 118 of the magnetic stacks 116 located at the junction of the bitlines 112 and word lines 114 by running a current in the appropriate direction within the bit lines 112 and word lines 114 which changes the resistance of the magnetic stacks 116.

Figure 2:
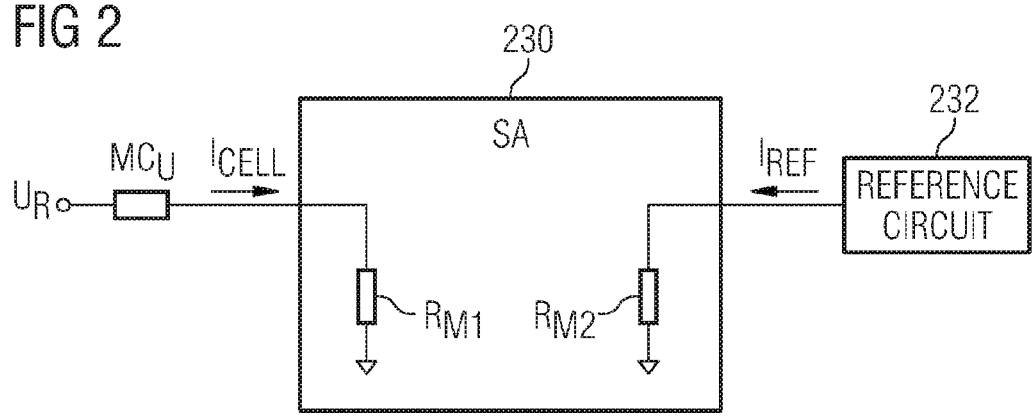
FIG. 2 shows an integrated circuit useable in conjunction with the memory device shown in FIG. 1.

In order to read the logic state stored in the free layer 118 of the magnetic stack 116, a schematic such as the one shown in FIG. 2, including a sense amplifier (SA) 230, is used to determine the unknown logic state stored in a memory cell MCu. A reference voltage $U_R$ is applied to one end of the unknown memory cell MCu. The other end of the unknown memory cell MCu is coupled to a measurement resistor $R_{m1}$. The other end of the measurement resistor $R_{m1}$ is coupled to ground. The current running through the unknown memory cell MCu is equal to current $I_{cell}$. A reference circuit 232 supplies a reference current $I_{ref}$ that is run into measurement resistor $R_{m2}$. The other end of the measurement resistor $R_{m2}$ is coupled to ground, as shown.

In the following description, it will be assumed that the memory cell 301 (FIG. 3) is a thermal selectable magneto-resistive memory cell. In this case, the programming current path 302 heats the memory cell 301 above a particular temperature. Then, the memory state of the memory cell 301 is programmed using a programming current. By heating the memory cell 301 before programming the memory cell 301, the required programming current strength can be reduced.

Figure 3:
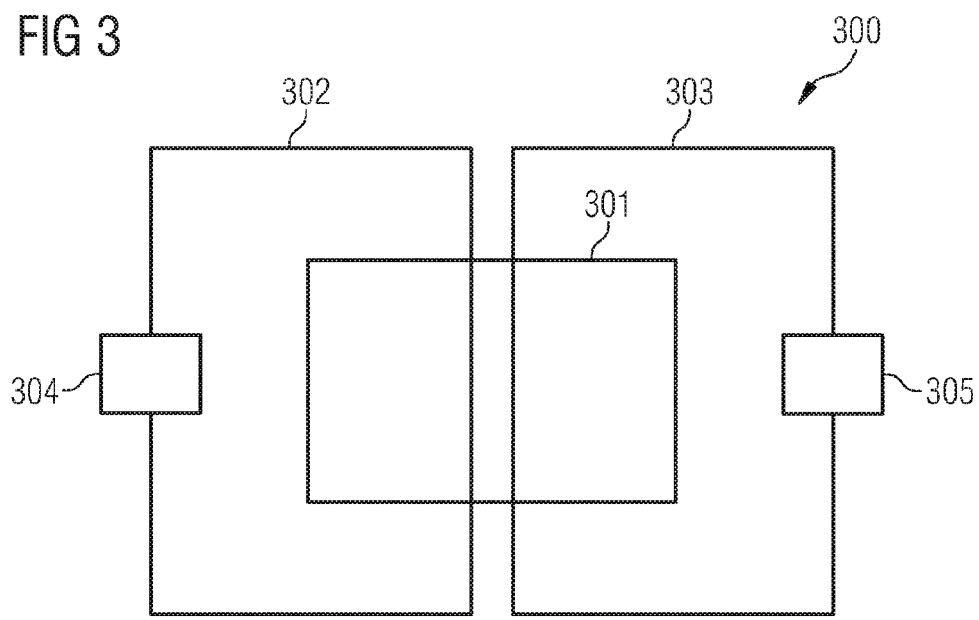
FIG. 3 shows a schematic drawing of a part of an integrated circuit according to one embodiment of the present invention.

FIG. 3 shows an integrated circuit 300 according to one embodiment of the present invention. The integrated circuit 300 includes a memory cell 301, a programming current path 302 used for programming/heating the memory cell 301, and a sensing current path 303 used for sensing the memory state of the memory cell 301. The heating current routed through the programming current path 302 is generated by a heating current generating unit 304, whereas the sensing current routed through the sensing current path 303 is generated by a sensing current generating unit 305. As can be derived from FIG. 3, the programming current path 302 and the sensing current path 303 are completely separated from each other. One effect of the separation of the programming current path 302 and the sensing current path 303 is that each current path can be optimized for a unique purpose. That is, the programming current path 302 can be optimized in respect of heating aspects, whereas the sensing current path 303 can be optimized in respect of sensing aspects. As a consequence, both the memory cell heating process and the memory cell sensing process can be improved.

Figure 4:
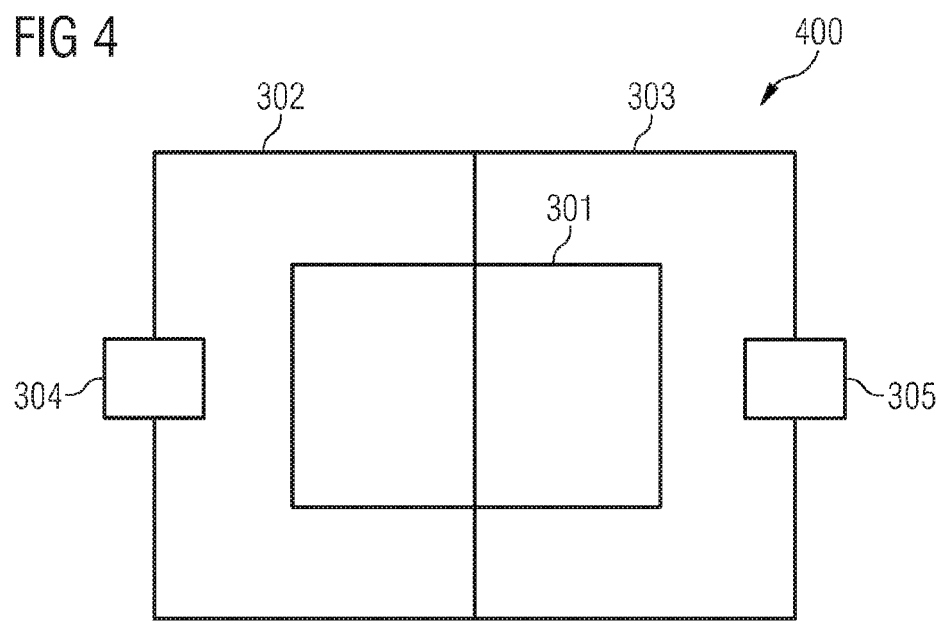
FIG. 4 shows a schematic drawing of a part of an integrated circuit according to one embodiment of the present invention.

FIG. 4 shows an integrated circuit 400 having the same architecture as that shown in FIG. 3 except of that the programming current path 302 and the sensing current path 303 are only partly separated from each other. That is, at least a part of the current paths located within the memory cell 301 are "condensed" into one single current path.

Figure 5:
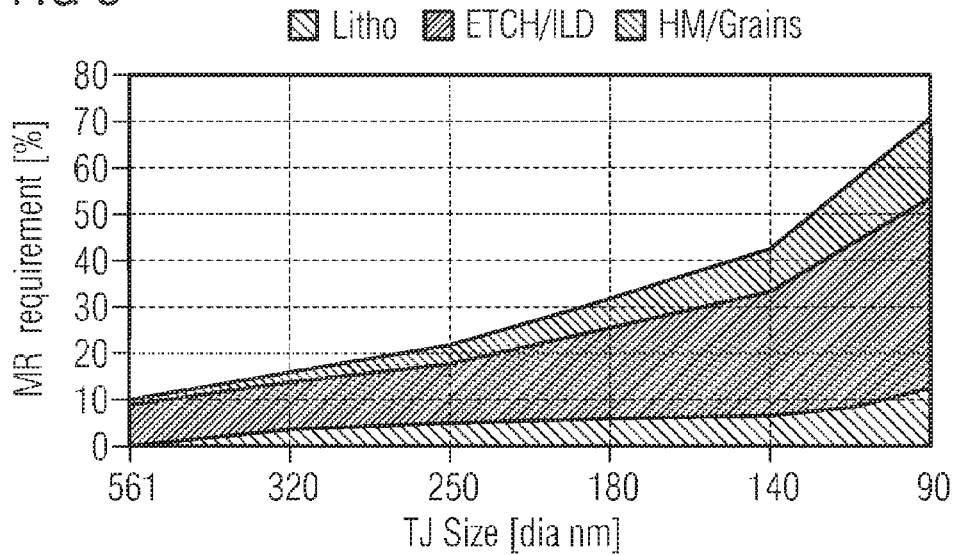
FIG. 5 shows a schematic drawing illustrating the relationship between magneto resistance requirements and tunneling junction size.

FIG. 5 shows that decreasing tunnel junction sizes of memory elements of magneto-resistive memory cells imply increasing memory element magneto resistance requirements. For example, FIG. 5 shows the required MR (in the following also referred to as "TMR") signal ratio (MR:=(R1−R0)/R0, where R0 is the resistance of the low resistance state, and R1 is the resistance of the high resistance state of the memory cell) which is needed in order to ensure a sufficient read margin taking into account cell size fluctuations which will relatively increase for smaller MTJ (magnetic tunneling junction) sizes. The cell size fluctuations depend on the shape fidelity of lithographic processes, etching steps during hard mask processes defining the MTJ shapes, and subsequent MTJ stack etching processes. For example, in order to perform a memory state reading process using a value of 300 mV, a magneto resistance requirement of about 70% is implied if the tunnel junction size is about 90 nm in diameter. As can be derived from this 70%, the largest part is required due to ("consumed by") the etch/ILD process. It has been assumed in FIG. 5 that the lithographic process is about a 193 nm lithographic process having about 0.15 nm fluctuation per edge within array, that the interlayer dielectric etching process has about a 0.4 nm CD loss fluctuation (about 8% from about 5 nm CD loss), and that the grain size is about 10 nm.

Figure 6:
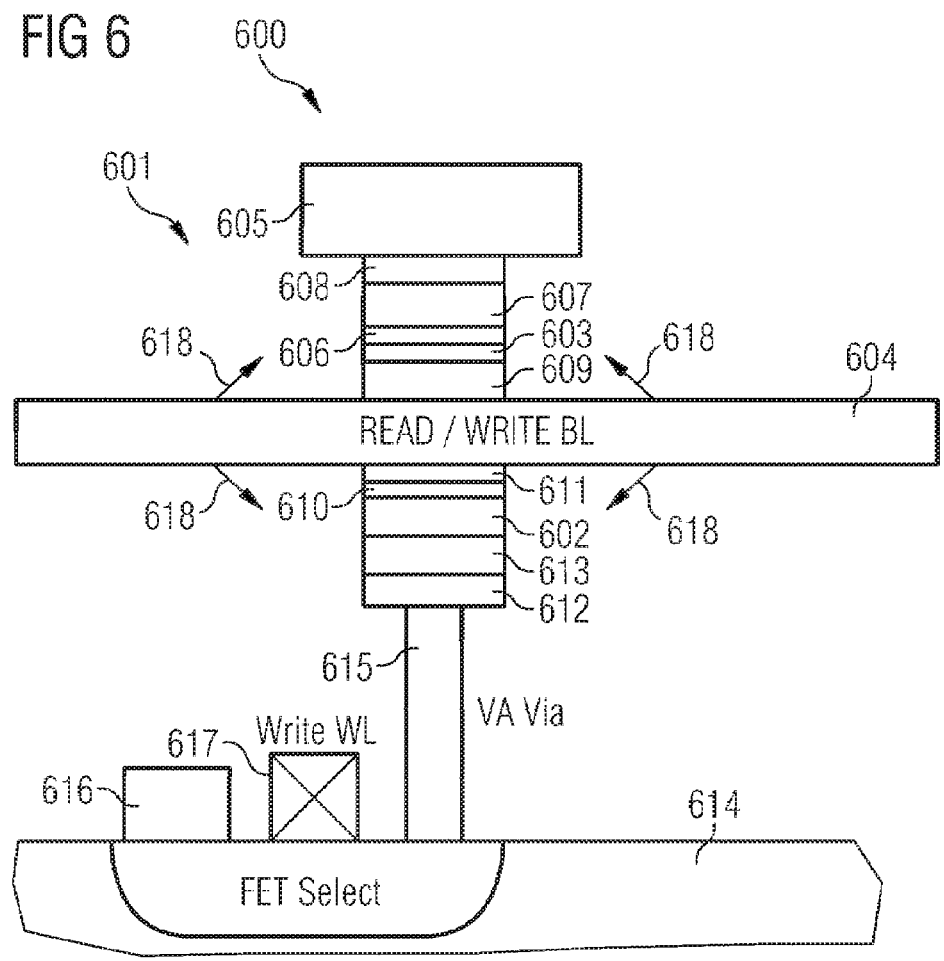
FIG. 6 shows a cross-sectional view of a part of an integrated circuit according to one embodiment of the present invention.

FIG. 6 shows a cross-sectional view of a part of an integrated circuit 600 according to one embodiment of the present invention. The integrated circuit 600 includes a plurality of memory cells 601 (here, only one memory cell is shown) which may, for example be arranged as a memory cell array having memory cell rows and memory cell columns. The memory cell 601 includes a storage memory element 602 (e.g., storage free layer) and a sensing memory element 603 (e.g., sensing free layer), wherein the storage memory element 602 is spatially separated from the sensing memory element 603. A first conductive line 604 is arranged between the storage memory element 602 and the sensing memory element 603. The first conductive line 604 may also be replaced by a conductive plate. A second conductive line 605 is arranged above the sensing memory element 603. Between the sensing memory element 603 and the second conductive line 605, a sensing barrier 606, a reference layer 607 having an antiferromagnet, and a cap layer 608 are stacked above each other in this order. Between the first conductive line 604 and the sensing memory element 603, a seed layer 609 is disposed. Between the storage memory element 602 and the first conductive line 604, a heating area 610 and a cap layer 611 are stacked above each other in this order. Below the storage memory element 602, a seed layer 612 and a reference layer 613 having an antiferromagnet are stacked above each other in this order.

The seed layer 612 is connected to a semiconductor substrate 614 by means of a conductive via 615. The semiconductor substrate 614 is connected to an element 616 set to ground potential (more generally: to a fixed potential). Further, a third conductive line 617 is disposed above the top surface of the semiconductor substrate 614.

Here, the first conductive line 604 (conductive plate) is a read/write bit line, the second conductive line 605 is a read word line, and the third conductive line 617 is a write word line. The third conductive line 617 is used as gate electrode to connect the conductive element 616 which is set to ground potential (more general: fixed potential) to the storage memory element 602 in order to route a heating current (programming current) through the storage memory element 602.

According to one embodiment of the present invention, the storage memory element 602 and the sensing memory element 603 are exchanged with each other, i.e., the storage memory element is disposed above the first conductive line 604, and the sensing memory element 603 is disposed below the first conductive line 604.

The positions of the sensing barrier 606 and the heating barrier 610 may also be changed. For example, the sensing barrier 606 may be located between the sensing memory element 603 and the first conductive line 604, and the heating barrier 610 may, for example, be located below the storage memory element 602.

If the memory cell 601 is heated, a heating current flows between the conductive element 616 and the first conductive line 604 which causes the heating barrier 610 to produce heat. As soon as the storage memory element 602 has been heated above a particular temperature, a programming current is used to generate a magnetic field which causes the storage memory element 602 to adopt a particular magnetization. This means that the heating current flows through the storage memory element 602, however does not flow through the sensing memory element 603. After having cooled down the storage memory element 602, the magnetization of the storage memory element becomes permanent. The magnetization of the storage memory element 602 causes a magnetic stray field 618 which orients the magnetization of the sensing memory element 603 antiparallel. The memory state of the memory cell 601 is read out by routing a sensing current between the first conductive line 604 and the second conductive line 605, i.e., by routing a sensing current through the sensing memory element 603. This means that the sensing current path runs through the sensing memory element 603, however does not run through the storage memory element 602. In this way, the sensing memory element 603 is used to read out the stray field 618 of the programmed storage memory element 602. According to one embodiment of the present invention, the storage memory element 602 (storage free layer) is pinned using an antiferromagnetic system.

As has become apparent from the foregoing description, the first conductive line 604 is both part of the programming current path and the sensing current path of the memory cell 601. However, the present invention is not restricted thereto. The first conductive element 604 may, for example, also be split up into two conductive elements, wherein one of the two conductive elements is exclusively used for the programming current path, and the other one of the conductive element is exclusively used for the sensing current path.

According to one embodiment of the present invention, the thickness of the first conductive line 604 falls in a range extending from about 10 nm to about 50 nm.

As already indicated, the first conductive line 604 may be replaced by a conductive plate. The conductive plate may, for example, be a continuous plate which is shared between a plurality of memory cells 601.

According to one embodiment of the present invention, the thickness of the conductive plate falls in a range extending from about 5 nm to about 30 nm.

As already indicated before, according to one embodiment of the present invention, the sensing barrier 606 is optimized for sensing a memory state of the sensing memory element 603, whereas the heating barrier 610 is optimized for heating the storage memory element 602.

According to one embodiment of the present invention, the distance between the storage memory element 602 and the sensing memory element 603 falls within a range extending from about 30 nm to about 100 nm.

According to one embodiment of the present invention, the lateral distance between neighboring sensing memory elements 603 and neighboring storage memory element 602 is chosen such that a stray field caused by the magnetization of a storage memory element 602 does not change the magnetization of the neighboring sensing memory elements 603 and the magnetization of the neighboring storage memory elements 602.

According to one embodiment of the present invention, each sensing memory element 603 is electrically coupled to a first conductive line (read bit line) 604 and a second conductive line (read word line) 605 such that the sensing memory element 603, the first conductive line 604 and the second conductive line 605 together form a cross-point architecture.

According to one embodiment of the present invention, each sensing memory element 603 is electrically coupled to a first conductive line (read bit line) 604 and a second conductive line (read word line) 605 such that the sensing memory element 603, the first conductive line 604 and the second conductive line 605 together form a cross-point architecture, wherein a diode or diode like select device (not shown) is assigned to each sensing memory element 603, the select device being positioned between the corresponding first conductive line 604 and the corresponding second conductive line 605, and being electrically coupled to at least one of the corresponding first conductive line 604 and the corresponding second conductive line 605 and one ferromagnetic electrode of the corresponding sensing memory element 603.

According to one embodiment of the present invention, each sensing memory element 603 is electrically coupled to a first conductive line (read bit line) 604 and a second conductive line (read word line) 605 such that the sensing memory element 603, the first conductive line 604 and the second conductive line 605 together form a cross-point architecture, wherein a field effect transistor (FET) or field effect transistor like select device (not shown) is assigned to each memory sensing element 603 which is positioned between the corresponding first conductive line 604 and the corresponding second conductive line 605, and is electrically coupled to at least one of the corresponding first conductive line 604 and the corresponding second conductive line 605 and one ferromagnetic electrode of the corresponding sensing memory element 603. The select device is selected for read operation by a read word line (not shown). Optionally, the first conductive line 604 can be a conductive common plate electrode.

According to one embodiment of the present invention, the thermal heating of the storage memory element 602 can be accomplished using unidirectional currents or bidirectional currents. In case of unidirectional currents, select devices such as diodes can be used. For example, according to one embodiment of the present invention, the memory cell 600 is connected to an unidirectional select device (for example, a diode) which is positioned between the third conductive line (write word line) 617 and the via 615 contacting the storage memory element 602. That is, in this example, the FET select element shown in FIG. 6 is replaced by a diode select element. Bi-directional currents may, for example, be used in order to avoid electron migration within the memory cell 600. Electron migration may occur if the heating current is routed through the storage memory element 602 always using the same heating current routing direction. Thus, a change of the heating current routing direction can avoid the electron migration.

According to one embodiment of the present invention, instead of programming the storage memory element 602 using heating currents, the storage memory element 602 may also be programmed using spin torque effects ("spin injection current switching"). That is, the storage memory element 602 may be programmed using an interaction between a programming current routed through the storage memory element 602, and a magnetic moment of memory areas of the storage memory element 602. In this case, depending on the memory state to be programmed, a programming current is routed from the conductive element 616 to the first conductive line 604, or a programming current is routed from the first conductive line 604 to the conductive element 616.

According to one embodiment of the present invention, in case that the sensing memory element 603, the first conductive line 604, and the second conductive line 605 together form a cross-point architecture, one common select device may be shared by a plurality of neighboring sensing memory elements 603. The common select device may be positioned between corresponding first conductive lines 604 and second conductive lines 605, and, for example, electrically be coupled to a plurality of first conductive lines 604 (or a plurality of second conductive lines 605) and corresponding ferromagnetic electrodes of the sensing memory elements 603. One effect of this embodiment is that parasitic currents occurring in a memory cell array of sensing memory element 603 having a cross-point architecture can be reduced during reading processes.

Figure 7:
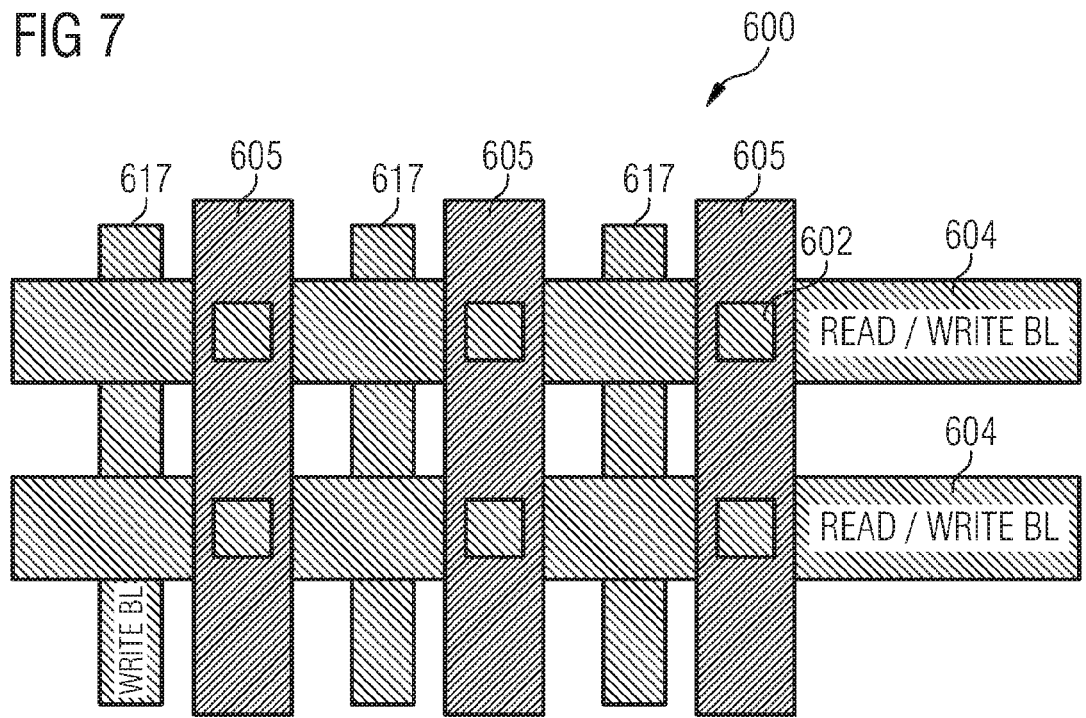
FIG. 7 shows a schematic top view of a part of an integrated circuit according to one embodiment of the present invention.

FIG. 7 shows a top view of a possible layout of the first conductive lines 604, the second conductive lines 605, and the third conductive lines 617 of the integrated circuit 600.

Figure 8:
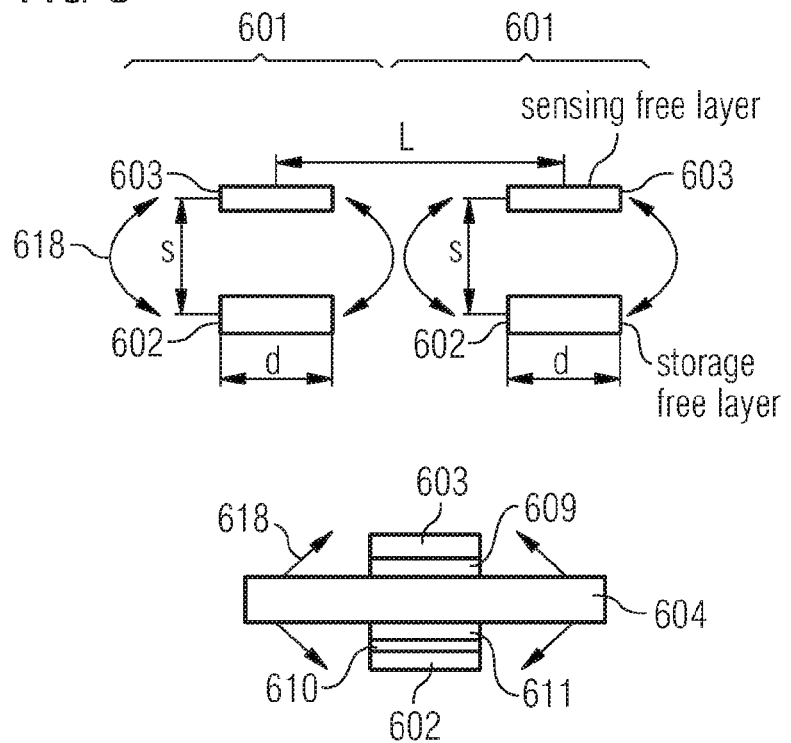
FIG. 8 illustrates the spatial relationships between neighboring memory cells of an integrated circuit according to one embodiment of the present invention.

FIG. 8 shows an embodiment of spatial relationship between the storage memory elements 602 and the sensing memory elements 603 of two neighboring memory cells 601. According to one embodiment of the present invention, the pitch L between the two neighboring memory cells 601 is larger than the distance s between the storage memory element 602 and the sensing memory element 603 of a memory cell 601.

According to one embodiment of the present invention, the distance s between a storage memory element 602 and a sensing memory element 603 belonging to the same memory cell 601 is smaller than or equal to the diameter d (lateral extent) of the storage memory element 602.

To give a concrete example: If the diameter d is assumed to be 65 nm (which is here assumed to be F), the distance s may be chosen to be smaller than 65 nm, the pitch L may be chosen to be 2 to 3 F which corresponds to 130 to 180 nm which is larger than the distance s. The distance s may, for example, be up to about 60 nm.

According to one embodiment of the present invention, the thickness of the storage memory element 602 ranges between about 2 nm to about 10 nm, or is about 4 nm.

According to one embodiment of the present invention, the thickness of the heating barrier 610 ranges between about 0.5 nm to about 2 nm, or between about 1 nm to about 2 nm.

According to one embodiment of the present invention, the thickness of the cap layer 608 and of the cap layer 611 ranges between about 5 nm to about 20 nm, or is about 10 nm.

According to one embodiment of the present invention, the thickness of the first conductive line 604 ranges between about 7 nm to about 50 nm, or is about 30 nm.

According to one embodiment of the present invention, the thickness of the seed layer 609 ranges between about 2 nm to about 15 nm, or is about 10 nm.

Figure 9B:
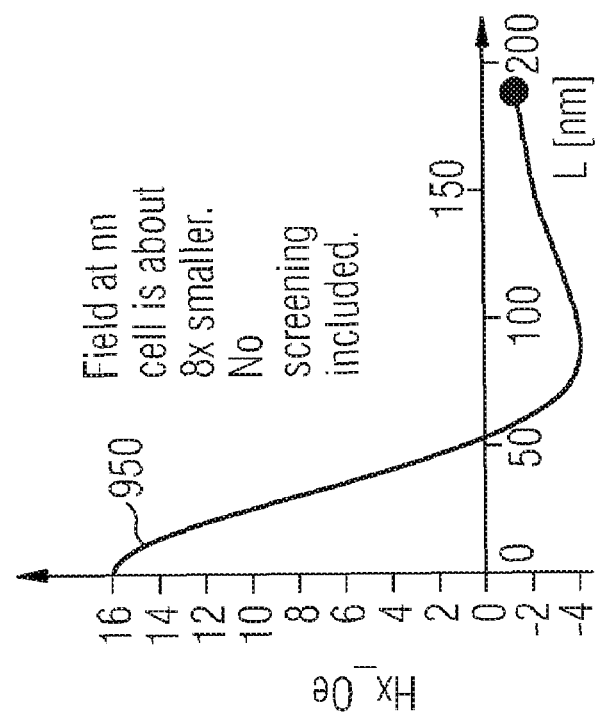
FIG. 9B illustrates the strength of a stray field caused by a memory cell in dependence on a second memory cell parameter.
Figure 9A:
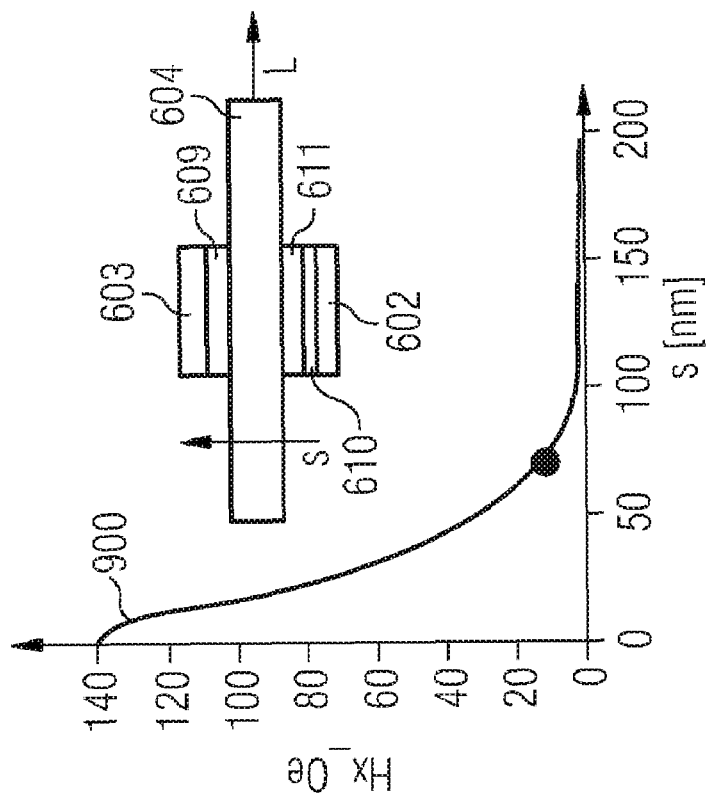
FIG. 9A illustrates the strength of a stray field caused by a memory cell in dependence on a first memory cell parameter.

FIG. 9A shows a simulation 900 of the strength of a stray field as a function of distance s at a lateral pitch distance L=0 caused by a storage memory element 602 assuming that the diameter d of the storage memory element 602 is about 65 nm, the thickness of the storage memory element 602 being 4 nm, wherein the storage memory element 602 has a saturation magetization of Ms=0.5 Tesla. The top surface and the bottom surface of the storage memory element 602 have a quadratic shape.

FIG. 9B shows a simulation 950 of the strength of the stray field caused by the storage memory element 602 along the distance L. The simulation shown in FIG. 9B has been made under the same assumptions underlying the simulation shown in FIG. 9A. As can be derived from FIG. 9B, the stray field caused by the storage memory element 602 is about 8 times smaller at a neighboring storage memory element 602. In the simulation shown in FIG. 9B it has been assumed that the distance s (vertical distance between the storage memory element 602 and the point at which the strength of the stray field is simulated) is about 65 nm. Practically, a further reduction of the stray field and therefore magnetic cell to cell interaction is to be expected, since shielding effects from the sensing layer located at the memory cell and located in neighbouring memory cells will significantly reduce the stray field effects.

As an example, FIG. 10 and FIG. 1 show a stray field originating from the storage element along various lateral directions.

FIG. 10A shows a simulation 1050 of the strength of the stray field caused by the storage memory element 602 along a direction indicated by arrow 1000 in FIG. 10B. As can be derived from FIGS. 10A and 10B, the strength of the stray field originated from the storage memory element 602 of a first memory cell 1001 is about 16 times smaller at a second memory cell 1002 (next neighbor memory cell). No screening effects of the next neighbor memory cells are considered within the simulation shown in FIG. 10A (e.g., screening effects caused by the sensing memory elements 603).

FIG. 11A shows a simulation 1100 of the strength of the stray field along a direction indicated by arrow 1000 in FIG. 11B. As can be derived from FIGS. 11A and 11B, the strength of the stray field originated from the storage memory element 602 of a first memory cell 1001 is about 8 to 16 times smaller at a second memory cell 1002 (next neighbor memory cell). No screening effects of the next neighbor memory cells are considered within the simulation shown in FIG. 11A (no screening effects caused by the sensing memory elements 603).

The first conductive line 604 has to carry a sufficiently strong switching current. Therefore, a minimal thickness is required to avoid reliability issues of the first conductive line 604. FIG. 12 shows different memory cell operating parameters being dependent on the dimensions of the bit lines, for example, the dimension of the first conductive line 604 shown in FIG. 6. As can be derived from FIG. 12, bit line thicknesses ranging between about 20 and about 30 nm yield reasonable memory cell operating parameters (reliability).

FIG. 13 shows a method 1300 of operating an integrated circuit according to one embodiment of the present invention. At 1301, a programming current is routed through a memory cell. At 1302, the memory cell is programmed using a programming current. At 1303, a sensing current is routed through the memory cell, wherein a programming current path used for routing the programming current through the memory cell is at least partly different from a sensing current path used for routing the sensing current path through the memory cell.

Embodiments of the present invention further provide a method of manufacturing a memory cell. The method includes: providing a storage memory element; providing a conductive line or conductive plate above the storage memory element; and providing a sensing memory element above the conductive line or conductive plate, wherein the storage memory element, the conductive line or plate, and the sensing memory element are provided such that the storage memory element is electrically connected to the sensing memory element via the conductive line or conductive plate.

Embodiments of the present invention further provide a memory cell which is connectable to a programming current path used for heating the memory cell, and a sensing current path used for sensing the memory state of the memory cell. The programming current path and the sensing current path are at least partly separated from each other.

The present invention further provides a memory module including at least one integrated circuit including an arrangement of memory cells, wherein each memory cell is connected to a programming current path used for heating the memory cell, and a sensing current path used for sensing the memory state of the memory cell. The programming current path and the sensing current path are at least partly separated from each other. According to one embodiment of the present invention, the memory module is stackable.

As shown in FIGS. 14A and 14B, in some embodiments, memory devices or integrated circuits such as those described herein may be used in modules. In FIG. 14A, a memory module 1400 is shown, on which one or more integrated circuits 1404 are arranged on a substrate 1402. The memory module 1400 may also include one or more electronic devices 1406, which may include memory, processing circuitry, control circuitry, addressing circuitry, bus interconnection circuitry, or other circuitry or electronic devices that may be combined on a module with memory devices, such as the integrated circuits 1404. Additionally, the memory module 1400 includes multiple electrical connections 1408, which may be used to connect the memory module 1400 to other electronic components, including other modules.

As shown in FIG. 14B, in some embodiments, these modules may be stackable, to form a stack 1450. For example, a stackable memory module 1452 may contain one or more integrated circuits 1456, arranged on a stackable substrate 1454. The stackable memory module 1452 may also include one or more electronic devices 1458, which may include memory, processing circuitry, control circuitry, addressing circuitry, bus interconnection circuitry, or other circuitry or electronic devices that may be combined on a module with a memory device, such as the integrated circuits 1456. Electrical connections 1460 are used to connect the stackable memory module 1452 with other modules in the stack 1450, or with other electronic devices. Other modules in the stack 1450 may include additional stackable memory modules, similar to the stackable memory module 1452 described above, or other types of stackable modules, such as stackable processing modules, control modules, communication modules, or other modules containing electronic components.

In the following descriptions, further features of exemplary embodiments of the present invention will be explained.

Next generation MRAM scaling schemes rely on the heating of selected cells to overcome the activation energy problematic of small magnetic elements. Usually, a heating current is driven across the tunnel barrier to heat up the MTJ (magnetic tunneling junction) stack above the Curie temperature of the free layer or the blocking temperature of the pinned free layer to allow programming of the information bit under the presence of a magnetic writing field.

However, these large heating currents cause significant issues with the barrier reliability and put additional constraints on the available TMR signal, breakdown voltage, etc.

According to one embodiment of the present invention, a separated current path is used for reading and writing. The heating is done via a current through a free layer without a MTJ barrier in series. The reading is done via a sensor element vertically on top or below the storage free layer.

Thus, according to one embodiment of the present invention, the programming current path is decoupled from the reading current path in order to allow best heating performance and best reading performance.

According to one embodiment of the present invention, high MR (magneto resistance) materials and high R (resistance) junctions are used in order to obtain good TMR (tunnel magneto resistance) signals and in order to allow realistic scaling without the need for self referencing (TMR:=(R1−R0)/R0)

According to one embodiment of the present invention, disadvantages resulting from large offset fields of the free layer can be avoided since they are screened by the sensing layers.

According to one embodiment of the present invention, high currents routed through the sensing barrier which destroy the sensing barrier (breakdown voltage) can be avoided.

According to one embodiment of the present invention, high MR barriers can be achieved since no compromise has to be done to get low R barriers.

According to one embodiment of the present invention, the reading path and sensing part of the memory cell are optimized for the reading circuit, and the writing path and the storage part of the memory element are optimized for desired write performance (endurance, heating barrier reliability, speed, data retention, etc.) and select device and write circuit.

One effect of embodiments of the present invention is that the heating efficiency does not depend on the resistance state of the free layer ("0" vs. "1").

One effect of embodiments of the present invention is that difficulties when generating pinholes can be avoided since thick barriers can be used which means that break down issues of the barrier do not apply.

One effect of embodiments of the present invention is that heating currents for the 0-state and the 1-state do not have to be compensated for.

According to one embodiment of the present invention, a further reduction of the heating current can be achieved since higher writing voltages can be used (because the barrier breakdown as one major critical limitation does not apply anymore).

According to one embodiment of the present invention, the heating barrier includes or consists of thin dielectric materials (e.g., MgO or $Al_2O_3$) as well as metallic spacers (e.g., Cu, Ru, Ta), and/or combinations thereof.

According to one embodiment of the present invention, the sensing barrier includes or consists of aluminum oxide and/or magnesium oxide.

According to one embodiment of the present invention, there is a further potential to minimize needs for transistor sizes as a lower current strength is used compared to standard thermal select approaches.

According to one embodiment of the present invention, vertical stacking is used in order to minimize next neighbor coupling effects.

According to one embodiment of the present invention, the sensing free layer detects a stray field in the order of about 10 to about 20 Oe if the distance between the storage element and the sensing element is about 65 nm. When reducing the distance below about 65 nm, the detectable field increases. The shape anisotropy of the sensing layer comprising the sensing elements should be round within about 5% to about 10% precision.

According to one embodiment of the present invention, the storage fee layer heating is done via an ohmic resistive heating or tunneling resistive heating in an adjacent heating layer. This layer can be put also at a different position in the stack or be incorporated into the free layer (highly resistive free layer materials, laminated structures, etc.).

One effect of embodiments of the present invention is that high heating powers can be achieved without a damage of the barriers.

One effect of embodiments of the present invention is that the barrier reliability can be increased.

One effect of embodiments of the present invention is that an increased heating voltage can be used compared to standard TS (thermal select).

According to one embodiment of the present invention, the sensing memory element in the top level will have a fairly high resistive barrier to allow high MR values and high barrier reliability. No self referencing is required if the MR is sufficiently high (>70%), which is feasible with high MR materials such as MgO.

According to one embodiment of the present invention, the total magnetic stray field of the neighboring cells do not significantly alter the stray field of the storage memory cell, so that the sensing layer can detect the true information state of the storage memory cell.

According to one embodiment of the present invention, a sufficiently thick magnetic sensing layer can efficiently reduce the stray fields originating from the memory cells.

As an example, when assuming that the sensing layers has about half the magnetic moment of the free layer, the sensing layer can screen the stray field of the storage free layer of about 50%.

According to one embodiment of the present invention, the writing and storage mechanism is accomplished by an programming current through the storage memory cell.

According to one embodiment of the present invention, the programming current through the storage cell can be unidirectional or bidirectional According to one embodiment of the present invention, a unidirectional current is used for providing the heat to the storage memory cell.

According to one embodiment of the present invention, the storage memory element can also be operated based on spin torque switching mechanisms, wherein a bidirectional current is used to set the magnetic information of the storage element either to "0" or "1" depending on the polarity of the current.

According to one embodiment of the present invention, the storage memory element based on spin torque effects can be operated with in-plane or perpendicular anisotropy.

According to one embodiment of the present invention, the magnetization direction of the storage memory element and the sensing memory element can either be oriented in-plane or perpendicular to plane.

According to one embodiment of the present invention, the storage memory part of the cell is optimized for efficient spin torque programming current, wherein the spin torque based barrier of the memory cell and magnetic layers are selected to yield good write performance.

According to one embodiment of the present invention, the spin torque based barrier is chosen to be a thin dielectric barrier (e.g. $Al_2O_3$, MgO, TiOx, TaOx, SiOx) or a metallic spacer material (e.g., Ru, Cu, Ti, Ta, Al), and/or combinations thereof.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. An integrated circuit, comprising:
    an arrangement of memory cells,
        wherein each memory cell is connected to a programming current path used for programming the memory cell, and a sensing current path used for sensing a memory state of the memory cell,
        wherein the programming current path and the sensing current path are at least partially separated from each other,
        wherein the memory cells are thermal selectable magneto-resistive memory cells, or the memory cells are spin injection current switching selectable memory cells,
        wherein each memory cell comprises a storage memory element and a sensing memory element that is spatially separated from the storage memory element,
        wherein the programming current path runs through the storage memory element, and
        wherein the sensing current path runs through the sensing memory element; and
    a second conductive line disposed above a first conductive line or disposed above a conductive plate,
        wherein one of the sensing memory element and the storage memory element is electrically connected between the first conductive line and the second conductive line, or is electrically connected between the conductive plate and the second conductive line, and
        wherein the other one of the sensing memory element and the storage memory element is disposed below the first conductive line or the conductive plate, and is electrically connected to the first conductive line or the conductive plate.

2. The integrated circuit according to claim 1, wherein a distance between the sensing memory element and the storage memory element belonging to the same memory cell is chosen such that a stray field caused by magnetization of the storage memory element causes the sensing memory element to adapt the same magnetization as that of the storage memory element.

3. The integrated circuit according to claim 2, wherein a lateral distance between neighboring sensing memory elements and neighboring storage memory elements is chosen such that a stray field caused by the magnetization of the storage memory element does not change the magnetization of the neighboring sensing memory elements and the magnetization of the neighboring storage memory elements.

4. The integrated circuit according to claim 1, wherein the conductive plate is a continuous plate that is shared between a plurality of memory cells.

5. The integrated circuit according to claim 1, wherein the other one of the sensing memory element and the storage memory element is electrically connectable to a conductive element set to a fixed potential.

6. The integrated circuit according to claim 5, wherein the conductive element set to a fixed potential is connected to the other one of the sensing memory element and the storage memory element by applying a voltage to a third conductive line.

7. The integrated circuit according to claim 5, wherein the first conductive line or the conductive plate is a read/write bit line, the second conductive line is a read word line, and the third conductive line is a write word line.

8. The integrated circuit according to claim 1, further comprising a heating barrier that is heated by a heating current and that is connected between the storage memory element and one of the first conductive line, the second conductive line, and the conductive plate, or comprising a spin torque barrier that is connected between the storage memory element and one of the first conductive line, the second conductive line, and the conductive plate.

9. The integrated circuit according to claim 8, wherein a sensing barrier is connected between the sensing memory element and one of the first conductive line, the second conductive line, and the conductive plate.

10. The integrated circuit according to claim 9, wherein the sensing barrier is optimized for a memory state sensing process, and the heating barrier is optimized for a memory cell heating process, and the spin torque barrier is optimized for a memory cell writing process.

11. The integrated circuit according to claim 10, wherein a distance between the sensing memory element and the storage memory element belonging to the same memory cell is between 10 nm and 100 nm.

12. The integrated circuit according to claim 1, wherein a pitch between neighboring memory cells is larger than the distance between the storage memory element and the sensing memory element belonging to the same memory cell.

13. The integrated circuit according to claim 12, wherein the distance between the storage memory element and the sensing memory element of one memory cell is smaller than or equal to a lateral extent of the storage memory element.

14. A memory cell,
    wherein the memory cell is connectable to a programming current path used for heating the memory cell, and a sensing current path used for sensing a memory state of the memory cell, wherein the programming current path and the sensing current path are at least partially separated from each others, wherein the memory cell comprises a storage memory element and a sensing memory element that is spatially separated from the storage memory element, wherein the memory cell further comprises a second conductive line disposed above a first conductive line or disposed above a conductive plate, wherein one of the sensing memory element and the storage memory element is electrically connected between the first conductive line and the second conductive line, or is electrically connected between the conductive plate and the second conductive line, and wherein the other one of the sensing memory element and the storage memory element is disposed below the first conductive line or the conductive plate, and is electrically connected to the first conductive line or the conductive plate.

15. A memory module comprising at least one integrated circuit comprising an arrangement of memory cells, wherein each memory cell is connected to a programming current path used for heating the memory cell, and a sensing current path used for sensing a memory state of the memory cell, wherein the programming current path and the sensing current path are at least partially separated from each other, wherein each memory cell comprises a storage memory element and a sensing memory element that is spatially separated from the storage memory element, wherein the arrangement of memory cells further comprises a second conductive line disposed above a first conductive line or disposed above a conductive plate, wherein one of the sensing memory element and the storage memory element is electrically connected between the first conductive line and the second conductive line, or is electrically connected between the conductive plate and the second conductive line, and wherein the other one of the sensing memory element and the storage memory element is disposed below the first conductive line or the conductive plate, and is electrically connected to the first conductive line or the conductive plate.

16. The memory module according to claim 15, wherein the memory module is stackable.

17. A method of operating an integrated circuit comprising an arrangement of thermal selectable magneto-resistive memory cells, the method comprising:

routing a programming current through a memory cell;

programming the memory cell using the programming current; and routing a sensing current though the memory cell, wherein a programming current path used for routing the programming current through the memory cell is at least partially different from a sensing current path used for routing the sensing current through the memory cell, wherein the memory cell comprises a storage memory element and a sensing memory element that is spatially separated from the storage memory element, wherein the memory cell comprises a second conductive line disposed above a first conductive line or disposed above a conductive plate, wherein one of the sensing memory element and the storage memory element is electrically connected between the first conductive line and the second conductive line, or is electrically connected between the conductive plate and the second conductive line, and wherein the other one of the sensing memory element and the storage memory element is disposed below the first conductive line or the conductive plate, and is electrically connected to the first conductive line or the conductive plate.

18. A method of manufacturing a memory cell, the method comprising:

providing a storage memory element;

providing a first conductive line or conductive plate above the storage memory element;

providing a second conductive line disposed above the first conductive line or disposed above the conductive plate; and providing a sensing memory element;

wherein one of the sensing memory element and the storage memory element is electrically connected between the first conductive line and the second conductive line, or is electrically connected between the conductive plate and the second conductive line, and wherein the other one of the sensing memory element and the storage memory element is disposed below the first conductive line or the conductive plate, and is electrically connected to the first conductive line or the conductive plate.

19. The method according to claim 18, further comprising providing a select device.

* * * * *